United States Patent
Mattmann et al.

(10) Patent No.: US 8,278,656 B2
(45) Date of Patent: Oct. 2, 2012

(54) SUBSTRATE FOR THE EPITAXIAL GROWTH OF GALLIUM NITRIDE

(75) Inventors: Eric Mattmann, Paris (FR); Pascal Reutler, Paris (FR); Fabien Lienhart, Paris (FR)

(73) Assignee: Saint-Gobain Glass France, Courbevoie (FR)

( * ) Notice: Subject to any disclaimer, the term of this patent is extended or adjusted under 35 U.S.C. 154(b) by 254 days.

(21) Appl. No.: 12/668,676

(22) PCT Filed: Jul. 11, 2008

(86) PCT No.: PCT/FR2008/051316
§ 371 (c)(1),
(2), (4) Date: Jan. 12, 2010

(87) PCT Pub. No.: WO2009/013425
PCT Pub. Date: Jan. 29, 2009

(65) Prior Publication Data
US 2010/0207116 A1 Aug. 19, 2010

(30) Foreign Application Priority Data
Jul. 13, 2007 (FR) ................ 07 56496

(51) Int. Cl.
*H01L 29/12* (2006.01)
*H01L 29/22* (2006.01)
*H01L 31/0256* (2006.01)
*H01L 31/0296* (2006.01)

(52) U.S. Cl. .......... 257/43; 257/78

(58) Field of Classification Search .......... 257/43, 257/77–103, E33.072, E33.059, E33.065, 257/E33.057
See application file for complete search history.

(56) References Cited

U.S. PATENT DOCUMENTS

| 5,889,295 A * | 3/1999 | Rennie et al. ........... 257/96 |
| 6,838,308 B2 * | 1/2005 | Haga .................. 257/103 |
| 2003/0126742 A1 * | 7/2003 | Ting et al. ............. 438/754 |

(Continued)

FOREIGN PATENT DOCUMENTS
JP 2004-356196 12/2004

OTHER PUBLICATIONS

Hong, R. et al., "Enhancement of Near-Band-Edge Photoluminescence of ZnO Thin Films in Sandwich Configuration at Room Temperature", Journal of Applied Physics, vol. 99, No. 9, pp. 093520-93520 (Total pp. 3) (May 15, 2006) XP012084998.

(Continued)

*Primary Examiner* — Cuong Q Nguyen
(74) *Attorney, Agent, or Firm* — Oblon, Spivak, McClelland, Maier & Neustadt, L.L.P.

(57) ABSTRACT

The subject of the invention is a substrate that can be used as a substrate for the epitaxial growth of layers based on gallium nitride and comprising a support material (11, 21) coated on at least one of its faces with at least one multilayered stack comprising at least one zinc-oxide-based layer (13, 24). The substrate is coated with a semiconductor structure of III-N or II-VI type, and it is characterized in that placed between the support material (11, 21) and said at least one zinc-oxide-based layer (13, 24) is at least one intermediate layer (12, 23) comprising oxides with at least two elements chosen from tin (Sn), zinc (Zn), indium (In), gallium (Ga) and antimony (Sb).

20 Claims, 3 Drawing Sheets

U.S. PATENT DOCUMENTS

2005/0017261 A1 1/2005 Ishizaki
2006/0006795 A1* 1/2006 Strip .............................. 313/504
2008/0105293 A1* 5/2008 Lu et al. ......................... 136/246

OTHER PUBLICATIONS

Kim, Y. J. et al., "Effects of ZnO Buffer Layer On The Luminous Properties of Thin-Film Phosphors Deposited on ZnO/ITO/Glass Substrates", Journal of Vacuum Science and Technology A. Vacuum, Surfaces and Films, vol. 19, No. 4, pp. 1095-1098 (Jul./Aug. 2001) XP 012005591.

Chen, X. L. et al., "Two-Step Growth of ZnO Films With High Conductivity and High Roughness", Journal of Crystal Growth, vol. 299, No. 1, pp. 77-81 (Feb. 1, 2007) XP005869978.

Mei, Y.F. et al., "Room-Temperature Electrosynthesized ZnO Thin Film With Strong (0 0 2) Orientation And Its Optical Properties", Applied Surface Science, vol. 252, No. 8, pp. 2973-2977 (Feb. 15, 2006) XP005262698.

Perkins, J.D. et al., "Combinatorial Studies of Zn-Al-O and Zn-Sn-O Transparent Conducting Oxide Thin Films", Thin Solid Films, vol. 411, No. 1, pp. 152-160, (May 22, 2002) XP 004367246.

* cited by examiner

SUBSTRATE FOR THE EPITAXIAL GROWTH OF GALLIUM NITRIDE

The present application is the U.S. counterpart of WO 2009/013425, the text of which is incorporated by reference and claims the priority of the French application No. 07 56496 filed on 13 Jul. 2007, the text of which is incorporated by reference.

The present invention relates to the field of semiconductors of the III-N or II-VI type, in particular those based on gallium nitride (GaN) and especially used in electronic components such as light-emitting diodes (LEDs) or transistors. It relates more particularly to a novel type of substrate on which it is possible to grow especially gallium-nitride-based layers.

Gallium nitride is a semiconductor with a gap of around 3.45 eV. It is currently used for the production of light-emitting diodes emitting in the wavelength range from blue to violet. The essential element of these diodes, in their simplest expression, consists of a p-n junction comprising GaN based layers deposited on a substrate. The GaN-based layers comprise in general layers comprising materials of general formula $In_xGa_yAl_{1-x-y}N$, where x and y vary from 0 to 1. They are usually obtained by heteroepitaxy using an MOCVD (metal organic chemical vapor deposition) technique with the aid of organometallic precursors such as triethylgallium or trimethylgallium and ammonia) at very high temperatures (between 1000° C. and 1200° C.) Owing to these high temperatures, the substrates that can be used are sapphire ($\alpha$-$Al_2O_3$, also called corundum) or silicon carbide (SiC). However, because of the large lattice mismatch between GaN and sapphire (about 14%) and the large difference between their respective thermal expansion coefficients, the GaN thus obtained has a crystallinity of poor quality and a large number of crystal defects (with a defect density, especially dislocation density, ranging up to $10^{10}/cm^2$), thereby limiting both the emission intensity (light and energy efficiency) and the lifetime of the diodes.

More recently, alternative deposition processes have been proposed which, thanks to a lower deposition temperature allow the use of substrates that are better suited from the crystallographic standpoint and are less expensive. As examples, mention may be made of PLD (pulsed laser deposition), PAMBE (plasma-assisted molecular beam epitaxy), RPCVD (remote-plasma chemical vapor deposition) and ENABLE (energetic neutral atom beam lithography/epitaxy) processes. These processes make it possible to deposit GaN at temperatures below 800° C., or even below 100° C. in certain of them. Thus, it becomes possible to employ other types of substrates, especially those more suitable in terms of lattice parameters.

Patent document U.S. Pat. No. 6,362,496 B1 discloses a substrate for growing GaN at low temperature, comprising a borosilicate glass substrate coated with a zinc oxide (ZnO) layer.

Zinc oxide has the advantage of possessing a hexagonal structure of the wurtzite type, the a-axis of which has a length of about 0.32 nm, i.e. almost identical to the length of the a-axis of GaN. Owing to this similarity in terms of crystallographic structure and lattice parameters (of the order of 2% in relative terms), the epitaxial growth of GaN is very considerably favoured.

One object of the invention is to further improve the crystallinity of GaN, or, more generally speaking, semiconductors of III-N type (such as GaN) or of II-IV type (such as ZnO), so as, in particular, to increase the emission intensity and the lifetime of light-emitting diodes comprising this material.

Another object of the invention is therefore to provide a substrate which is capable of improving these properties when semiconductor structures are deposited on it.

Another object of the invention is to provide a substrate that can be produced economically and with large dimensions.

For this purpose, one subject of the invention is a substrate that can be used as a substrate for the epitaxial growth of layers based on gallium nitride and comprising a support material coated on at least one of its faces with at least one multilayered stack comprising at least one zinc-oxide-based layer, said substrate being coated with a semiconductor structure of III-N or II-VI type. The substrate is characterized in that placed between the support material and said at least one zinc-oxide-based layer is at least one intermediate layer comprising oxides with at least two elements chosen from tin (Sn), zinc (Zn), indium (In), gallium (Ga) and antimony (Sb).

Another subject of the invention is a substrate that can be used as a substrate for the epitaxial growth of layers based on gallium nitride and comprising a support material coated on at least one of its faces with at least one multilayered stack comprising at least one zinc-oxide-based layer. The substrate according to the invention is characterized in that placed between the support material and the at least one zinc-oxide-based layer is at least one intermediate layer comprising oxides of at least two elements chosen from tin (Sn), zinc (Zn), gallium (Ga) and antimony (Sb).

The first object of the invention is, therefore, a substrate coated with a semiconductor structure. This will be referred to as "coated substrate" hereinafter. The second object of the invention is a particular substrate specially adapted to the production of the first object, i.e. to the epitaxial growth of semiconductor structures of III-N or II-VI type.

The inventors have in fact demonstrated that the crystallinity of the GaN layer, or, more generally, of semiconductor layers of III-N or II-VI type, may also be improved by interposing such an intermediate layer between the support material and the ZnO layer.

This intermediate layer makes it possible to improve the crystallization properties of the semiconductor layers, by increasing in particular the amount of crystallized material and/or by promoting growth of gallium nitride or of zinc oxide along its c-axis, this axis being furthermore perfectly perpendicular to the surface of the support material.

It was also apparent to the inventors that the presence of this sublayer would help to improve the electronic conductivity of the ZnO/GaN or ZnO/ZnO stack. As a result, there is a more homogeneous current distribution within these layers, an increase in quantum yield and therefore a higher emission intensity, and a reduction in heat-up of the component and therefore an increase in its lifetime.

Preferably, the support material is coated on only one of its faces. The stack deposited on this support material preferably comprises a single ZnO-based layer and/or a single intermediate layer.

The support material may be of any type of material used as support in the field of electronics, such as sapphire, silicon carbide, silicon, a metal, such as copper, quartz, zinc oxide (ZnO) and spinels, such as $MgAl_2O_4$ and $LiGaO_2$. The effects of the invention reveal themselves to be more important for glassy or amorphous materials, the support material is preferably a glassy or amorphous material, such as silica glass or silica-based glasses. It may also be a glass-ceramic material, i.e. a material consisting of at least one glassy phase and of at least one crystalline phase. The term "silica-based glasses" is understood to mean glasses comprising silica with a weight content equal to or greater than 40%, generally 50%. Glasses resistant to high temperatures and to thermal shocks, such as borosilicate glasses, are preferred for cost reasons. Among preferred glasses are in particular the glasses employed as substrates for the manufacture of flat screens, liquid crystal displays (LCDs) or plasma display panels (PDPs). These glass substrates used in the field of electronics have the advantage of being available in large dimensions for a moderate cost. Their thermal expansion coefficient is also closer to that of GaN than the thermal expansion coefficient of sapphire. The glasses employed for manufacturing liquid crystal displays are generally aluminoborosilicate glasses containing no alkali metal oxides. The glasses employed for manufacturing plasma display panels are generally glasses consisting of alkaline-earth and alkali metal silicates. When the support material is a silica-based glass, the strain point of said glass is preferably equal to or above 550° C., or 600° C. or even 650° C. or 700° C., so as to be compatible with all "low-temperature" GaN deposition processes. The strain point of a glass corresponds to the temperature at which the viscosity of the glass is equal to $10^{14.5}$ poise ($10^{13.5}$ Pa.s).

The intermediate layer may be deposited on the support material in direct contact therewith.

Alternatively, at least one sublayer is preferably placed between the support material and the intermediate layer. This sublayer forms part of the stack and may in particular, when the support material comprises alkali metal ions, be a sublayer acting as barrier to the migration of the alkali metal ions. The term "acting as barrier" is understood to mean that the layer prevents the migration of a significant amount of alkali metal ions from the support material to the surface of the substrate. When the support material comprises alkali metal (lithium, sodium, potassium) ions, which is the case, for example for glass substrates employed in the manufacture of plasma display panels, these ions are liable to migrate into the GaN-based layer and disturb its semiconducting properties. This migration may, in particular occur when the substrate is subjected to high temperatures, therefore in particular during deposition of the GaN-based layers. It may also occur during operation of the electronic component (diode or transistor), the temperatures reached being lower, but the times being much longer. The sublayer acting as barrier to the migration of alkali metal ions may consist of the following materials, or be based on one of the following materials, or on any one of their mixtures: SiOC, $Si_3N_4$, $SiO_2$, TiN, and $Al_2O_3$.

Preferably, the intermediate layer is placed beneath the zinc-oxide-based layer in direct contact therewith, so as to directly influence the crystallization of the zinc oxide and subsequently the crystallization of the gallium nitride.

A preferred substrate consists of a support material coated on only one of its faces with a stack consisting of an intermediate layer and, deposited directly on this intermediate layer, a zinc-oxide-based layer.

The intermediate layer is preferably amorphous before the zinc-oxide-based layer is deposited. The term "amorphous" is understood to mean that X-ray diffraction methods cannot detect crystalline phases in significant quantity. Preferably, the proportion of amorphous phase is equal to or greater than 90% by weight, especially 95% and even 99% relative to the total weight of the material. Single oxides ($SnO_2$, ZnO, $In_2O_3$, $Ga_2O_3$, $Sb_2O_3$, possibly doped with other elements) are excluded as they are generally obtained during the deposition in at least predominantly crystallized form, which precludes the effect of improving the crystallization of gallium nitride.

The intermediate layer may, however, be capable of crystallizing, at least partly, after the zinc-oxide-based layer has been deposited, for example, under the effect of a heat treatment or an ion bombardment. This does not affect its effect on the subsequent crystallization of GaN-based layers. This is because it seems that the final technical effect of the intermediate layer is due to its influence on the zinc-oxide-based layer during deposition of the latter. Consequently, once the ZnO-based layer has been deposited, any modifications of the structure of the intermediate layer do not seem to have an effect on the deposition of the subsequent layers.

Preferably, the intermediate layer contains metal oxides chosen from Sn/Zn, Sn/In, Sn/Ga, Sn/Sb, Zn/In, Zn/Ga, Zn/Sb, In/Ga, In/Sb and Ga/Sb pairs. The intermediate layer may also comprise three metal oxides, for example, oxides of Sn/Zn/In, Sn/Zn/Sb, Sn/Zn/Ga, Zn/In/Sb, Zn/In/Ga, Sn/In/Sb, Sn/In/Ga, etc.

When the intermediate layer contains oxides of two elements chosen from Sn, Zn, In, Ga and Sb, the mass ratio of one of these elements relative to the other preferably varies between 10/90 and 50/50, especially between 20/80 and 45/55. Excessively low contents of one element relative to the other (for example, in the case of doping) are not preferred as they cause crystallization more easily, which, as we have seen, is generally undesirable.

Preferably, the intermediate layer is a layer based on zinc tin oxides, especially a layer of the SnZnO type. The expression "layer of the SnZnO type" is understood to mean any layer formed from any solid solution between ZnO on the one hand and SnO or $SnO_2$ on the other. This layer may or may not be stoichiometric, and in particular it may be substoichiometric. However, solid solutions having a composition of defined compounds, for example, $Zn_2SnO_4$, are not preferred as they have a tendency to crystallize spontaneously during their deposition. Now, as indicated above, it is preferable for the intermediate layer to be amorphous during deposition of the ZnO-based layer.

The layers based on zinc tin oxides exhibit good thermal and chemical stability. However, this stability is improved by doping by at least one atom chosen from Al, Ga, In, B, Y, La, Ge, Si, P, As, Sb, Bi, Ce, Ti, Zr, Nb and Ta. This doping may also make it easier to deposit the intermediate layer when it is produced by sputtering, especially magnetically enhanced sputtering (a process usually called magnetron sputtering). Al and Sb atoms, particularly Sb atoms, are preferred as the ionic radius of the associated ions is close to that of the ions associated with the Sn and Zn atoms. The content of dopant atoms is preferably between 0.5 and 5%, especially between 0.5 and 2% by weight, relative to the total amount of metal ions in the layer.

Preferably, the ZnO-based layer is a layer consisting of ZnO, especially polycrystalline ZnO crystallized in its hexagonal form (wurtzite-type structure). This is because it is necessary to promote the crystallization of ZnO in this form as much as possible in order to improve the crystallization of the underlying gallium-nitride-based layers.

A material is said to be "polycrystalline" within the context of the invention if it is composed of a plurality of crystals, and therefore if it is not a single crystal, independently of the orientation of said crystals (which may be identical for each of them). Preferably, these ZnO crystals have a single orientation, in particular along the c-axis perpendicular to the main surface of the substrate.

The ZnO-based layer may be employed as a transparent electrode within the multilayer stack when its electronic conductivity is high enough. For this purpose, the ZnO-based layer is preferably a ZnO layer or a doped ZnO layer, especially doped with aluminum (Al), indium (In) or gallium (Ga) atoms, so as to increase its electronic conductivity. Doping with gallium is preferred to doping with aluminum or indium, as the latter is liable to migrate into the GaN-based semiconductor structure, creating a risk of a short circuit. Thus, it is possible to create a stack deposited on a support material as defined above (in particular made of silica-based glass), said stack comprising a layer based on ZnO (especially ZnO or doped ZnO, for example, doped with Al, Ga or In) serving as heteroepitaxial growth layer for gallium-nitride-based layers. The ZnO-based layer may be deposited directly on the support material or on one or more sublayers, for example, the intermediate layer according to the invention. Owing to the transparency of the ZnO-based layer, this substrate can be used in a flip-chip diode structure in which the light is emitted from the side of the substrate. The ZnO-based layer then has three separate functions, namely to facilitate heteroepitaxy, to provide the current (via an ohmic contact) and to allow extraction of the light.

Advantageously, the ZnO-based layer is the final layer of the stack, hence the layer in contact with the atmosphere, insofar as it is preferable for the gallium nitride to be subsequently deposited directly on this layer. The substrate according to the invention preferably does not include a metal layer such as a silver layer or a layer containing nickel and/or chromium.

A preferred substrate consists of a glass support material coated on only one of its faces with a stack comprising a layer based on zinc tin oxides and, deposited directly on this layer a zinc-oxide-based layer (especially a ZnO layer), a sublayer acting as barrier to the migration of alkali metal ions being optionally placed between the support material and the layer based on zinc tin oxides and in direct contact with them.

The thickness of the ZnO-based layer (especially ZnO layer) is preferably between 10 and 500 nm. It has been observed that a relatively large thickness promotes better subsequent GaN growth, in particular by increasing the size of the crystallites. The thickness of the ZnO-based layer is therefore preferably between 100 and 300 nm.

The thickness of the intermediate layer is preferably between 2 and 100 nm, especially between 10 and 50 nm or even between 20 and 30 nm. Such thicknesses promote the crystalline growth of zinc oxide.

As indicated above, the subject of the invention is partly the "coated substrate". This coated substrate is a substrate according to the invention, coated with a semiconductor structure of III-N or II-VI type.

The semiconductor structure of III-N type preferably comprises at least one layer based on $In_xGa_yAl_{1-x-y}N$, where x and y vary from 0 to 1, and especially a layer based on gallium nitride (GaN). The term "GaN-based layer" is understood in general to mean any layer comprising undoped gallium nitride or doped (n- or p-doped) gallium nitride, hence a layer with the general formula $In_xGa_yAl_{1-x-y}N$ described above, in which y is non-zero and more generally greater than 0.5. The GaN-based layers may be undoped, n-doped (for example, doped with Si, Ge, Se, Te, etc. atoms) or p-doped (for example doped with Mg, Zn, Ca, Sr, Ba, etc. atoms).

The semiconductor structure of III-N type preferably comprises at least one n-doped GaN layer (for example, doped with Si, Ge, Se, Te, etc. atoms) and at least one p-doped GaN layer (for example, doped with Mg, Zn, Ca, Sr, Ba, etc. atoms). The ZnO-based layer is then preferably in direct contact with the at least one n-doped GaN layer. Alternatively, a buffer layer based on amorphous aluminum and/or gallium nitride may be placed between the ZnO-based layer and the semiconductor structure. Such a buffer layer is intended further to promote crystallization of the GaN-based layer.

The semiconductor structure of II-VI type preferably comprises at least one ZnO-based layer. The term "ZnO-based layer" is understood to mean any layer containing zinc oxide, for example, n-doped (using Al, In, etc.) or p-doped zinc oxide. This is because the ZnO-based layer of the substrate according to the invention may constitute an ideal epitaxial layer for semiconductor structures which are themselves based on ZnO.

The semiconductor structure may comprise or consist of at least one non-continuous layer formed from nanostructures, such as nanowires, or structures commonly referred to by the names nanorods, nanopillars or nanowires. These structures generally take the form of wires or columns directed along an axis approximately perpendicular to the surface of the substrate. These wires or columns preferably have a diameter of between 50 and 500 nm and a height of between 500 nm and 5 microns. These structures help to improve light guiding, by minimizing the light losses on the sides of the diode. These structures also create cavity effects, allowing light amplification.

The ZnO-based layer of the substrate is preferably in direct contact with the at least one GaN-based layer or ZnO-based layer of this semiconductor structure.

The substrate according to the invention, in particular the coated substrate according to the invention, may be employed for the manufacture of light-emitting diodes. These light-emitting diodes may, for example, be integrated into laser systems and/or employed in the field of illumination (road signs, road illumination, urban lighting, interior lighting or motor vehicle lighting), display screens, data storage, etc.

When the coated substrate is employed for the fabrication of light-emitting diodes, the semiconductor structure is preferably a heterostructure in the sense that it comprises heterojunctions, that is to say assemblies of semiconductors of various chemical compositions having different energy gaps, and preferably chosen from pure compounds or alloys of the $In_xGa_yAl_{1-x-y}N$ type, where x and y vary from 0 to 1. The variation of the parameters x and y allows the gap of the semiconductor to be influenced directly. The structures obtained are generally of the single quantum well (SQW) or multiple quantum well type. The diodes thus produced may emit within a wide range of the electromagnetic spectrum, covering the ultraviolet and visible range, and in particular the blue or green range. When coupled to phosphorescent materials, the diodes may also emit white light.

The substrate according to the invention may also serve as substrate for types of semiconductor structures other than diodes, for example, transistor structures such as bipolar transistors, FETs (field-effect transistors) especially of the MESFET (metal semiconductor field-effect transistor) or HFET (heterostructure field-effect transistor) type. Transistors employing GaN-based semiconductor structures are particularly advantageous in microwave (typically 5-50 GHz) applications and/or power (typically 50 W) applications. The transparent character of these semiconductor structures also means that transparent electronic devices may be envisaged.

The subject of the invention is also a process for obtaining the substrate according to the invention, in which said at least one zinc-oxide-based layer and said at least one intermediate layer are deposited by sputtering. Advantageously, the magnetron sputtering process is employed. Preferably, all of the layers of the stack are deposited by this technique, including consequently the optional sublayer placed between the support material and the intermediate layer. The process of sputtering, especially magnetron sputtering, has the advantage of growing the zinc-oxide-based layer along the c-axis, thus allowing subsequent epitaxial growth of GaN along this same axis. The magnetron process may be of the reactive or unreactive type.

The step of depositing the intermediate layer by sputtering preferably produces an amorphous layer for the reasons mentioned above.

A preferred process consists in depositing, by a magnetron process, an intermediate layer based on zinc tin oxides, as described above, on a glass support material, followed by a zinc-oxide layer. When the glass used contains alkali metal ions, it is preferable to deposit, also by a magnetron process, a sublayer acting as barrier to the migration of the alkali metal ions, as described above, especially an $Si_3N_4$ layer.

This deposition is preferably followed by a heat treatment intended to promote the crystallization of the zinc-oxide-based layer, as it appears that better crystallization of the zinc-oxide-based layer improves the crystallization of the superjacent layers. This heat treatment is generally carried out at temperatures of between 200 and 1100° C., especially between 200 and 700° C.

Alternatively, or in addition, improved ZnO crystallization may be obtained by depositing the layer on a hot substrate, the temperature of which is between 150 and 400° C., in particular between 200 and 300° C.

It is also possible to subject one or more of the layers of the stack, in particular, the ZnO-based layer, to the action of an ion beam, especially an argon ion beam. The ion beam is preferably generated by an ion gun or an ion source which may advantageously be positioned within the same sputtering deposition chamber. Depending on the power, the angle of incidence and the angle of divergence it is possible to smooth the ZnO layer (in order to increase its chemical resistance, especially its resistance to ammonia which may be employed during the GaN growth) or on the contrary to texturize the ZnO surface in order to promote lateral epitaxy and thus reduce or even eliminate dislocations.

The invention will be better understood with the aid of the following nonlimiting exemplary embodiments illustrated by FIGS. 1 to 4.

Figure 1:
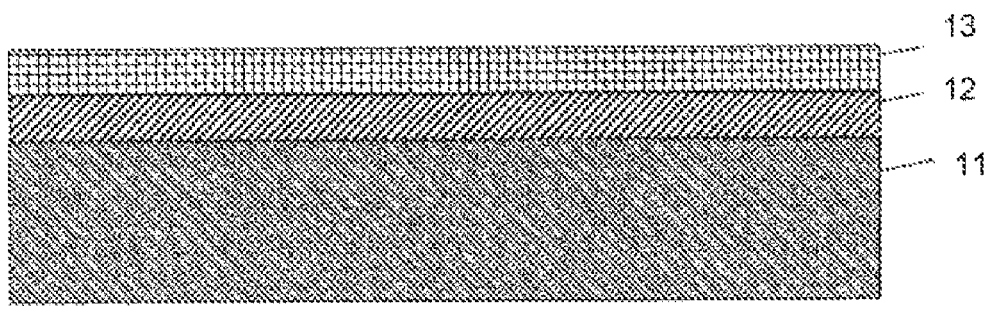
FIGS. 1 and 2 are schematic representations of substrates according to the invention.

FIG. 1 shows a schematic cross section of a preferred substrate according to the invention. The substrate is composed of a support material 11 coated with a stack consisting of an intermediate layer 12 coated with a ZnO-based layer 13.

Figure 2:
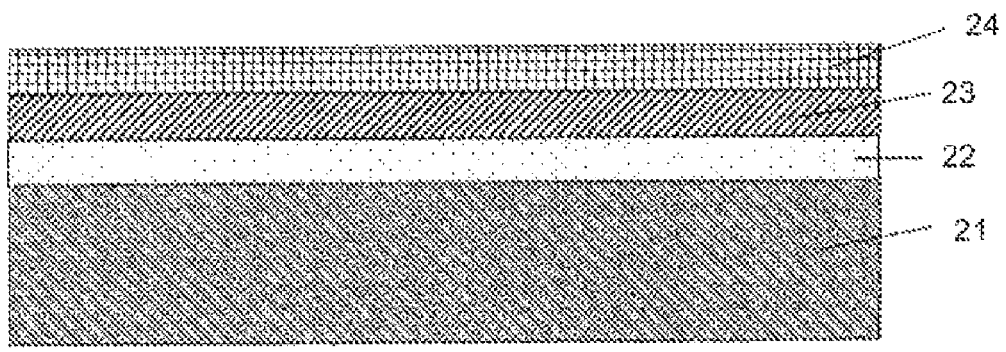

FIG. 2 shows a schematic cross section of another preferred substrate according to the invention. The substrate is composed of a support material 21 coated with a stack comprising a layer 22 acting as barrier to the migration of alkali metal ions, which is deposited directly on the support material 21 and is coated with an intermediate layer 23 which is itself coated with a ZnO-based layer 23.

As regards the substrates shown in FIGS. 1 and 2, the support material and the various layers of the stack are as described in the general part of the description. Preferably, the support material is made of glass, especially of the type intended for the manufacture of plasma display panels. The intermediate layer is advantageously based on zinc tin oxides, in particular doped with Al or Sb. The ZnO-based layer is preferably a ZnO layer. The optional layer acting as barrier to the migration of alkali metal ions is advantageously an $Si_3N_4$ layer.

COMPARATIVE EXAMPLES

The substrate according to the comparative example consisted of a glass support material coated with an $Si_3N_4$ sublayer acting as barrier to the migration of alkali metal ions and with a zinc oxide layer.

The stack was the following, the geometrical thicknesses being indicated between brackets:

glass/$Si_3N_4$ (20 nm)/ZnO (200 nm).

The glass employed was a glass intended for the manufacture of plasma display panels, as described in patent application WO 98/40320.

This stack was deposited by magnetron sputtering. The $Si_3N_4$ layer was deposited using a silicon target supplied with 5 kW/100 kHz power. The pressure was 2.5 microbar and the plasma gas was a mixture of argon (40 sccm (standard cubic centimeters per minute) flow rate) and nitrogen (58 sccm flow rate). The ZnO layer was deposited using a zinc target to which a 290 V/50 kHz voltage was applied, under a pressure of 2 microbar and an argon (40 sccm)/oxygen (18 sccm) mixture.

The deposition by magnetron sputtering of each of these layers was moreover well-known to those skilled in the art and the details of the deposition (target used, pressure, gas, etc.) had no significant influence on the results.

This substrate was then coated in a known manner with a GaN layer of 80 nm thickness (denoted by C1) or 200 nm thickness (denoted by C2) using the RPCVD (remote-plasma chemical vapor deposition) process. Any other type of deposition process compatible in terms of deposition temperature with the nature of the substrate used is of course possible without significantly influencing the result.

EXAMPLES ACCORDING TO THE INVENTION

The examples according to the invention differed from the comparative example in that a layer of antimony (Sb)-doped mixed zinc tin oxide was deposited between the $Si_3N_4$ sublayer and the zinc oxide layer, again by magnetron sputtering.

The SnZnO layer was deposited using a target formed from an antimony-doped tin/zinc alloy, a 2 kW power and a 50 kHz frequency, a pressure of 2 microbar and an argon (12 sccm)/oxygen (45 sccm) mixture.

The mixed oxide layer comprised, by weight of metals, approximately 65% Sn, 34% Zn and 1% Sb.

The various examples according to the invention differed by the thicknesses of the ZnO layer and of the zinc tin oxide layer.

Table 1 gives the thicknesses of these layers for each of Examples 1 to 4 according to the invention.

TABLE 1

| Example | $SnZnO_x$:Sb thickness (nm) | ZnO thickness (nm) |
| --- | --- | --- |
| 1 | 10 | 200 |
| 2 | 25 | 200 |
| 3 | 10 | 80 |
| 4 | 25 | 80 |

Effects on Crystallization

The effect of the invention on the crystallization of the GaN-based layer was studied by various methods.

According to a first method, the orientation of the GaN crystals was compared by measuring the area of the diffraction peaks associated with GaN in an X-ray diffraction diagram.

The X-ray diffraction was carried out in θ/2θ configuration. Because of the small difference in lattice parameters between ZnO and GaN, their peaks partly overlapped, requiring a mathematical treatment to separate them. This mathematical treatment was in particular based on the diffraction characteristics of the ZnO layer alone, these being measured before GaN deposition.

Table 2 indicates, in arbitrary units, the area of the diffraction peak associated with the (0002) crystallographic plane, which corresponds to an orientation of the crystals along the c-axis.

TABLE 2

| Example | Area (arbitrary units) |
|---|---|
| C2 | 350 |
| 1 | 570 |
| 2 | 680 |

These results reflect the very great improvement in the orientation of GaN along the c-axis thanks to the addition of the intermediate layer.

According to a second method, the orientation of the GaN crystals was compared by direct observation using scanning electron microscopy.

Figure 3:
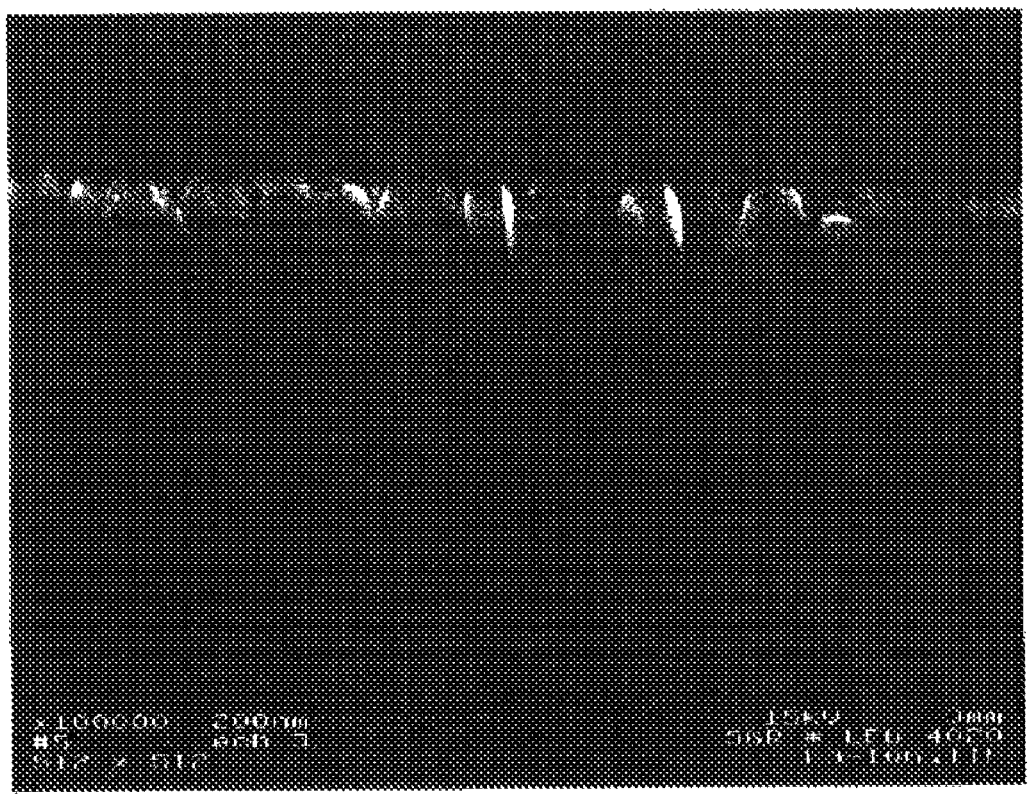
FIGS. 3 and 4 are scanning electron micrographs taken on the edge of specimens described below.
Figure 4:
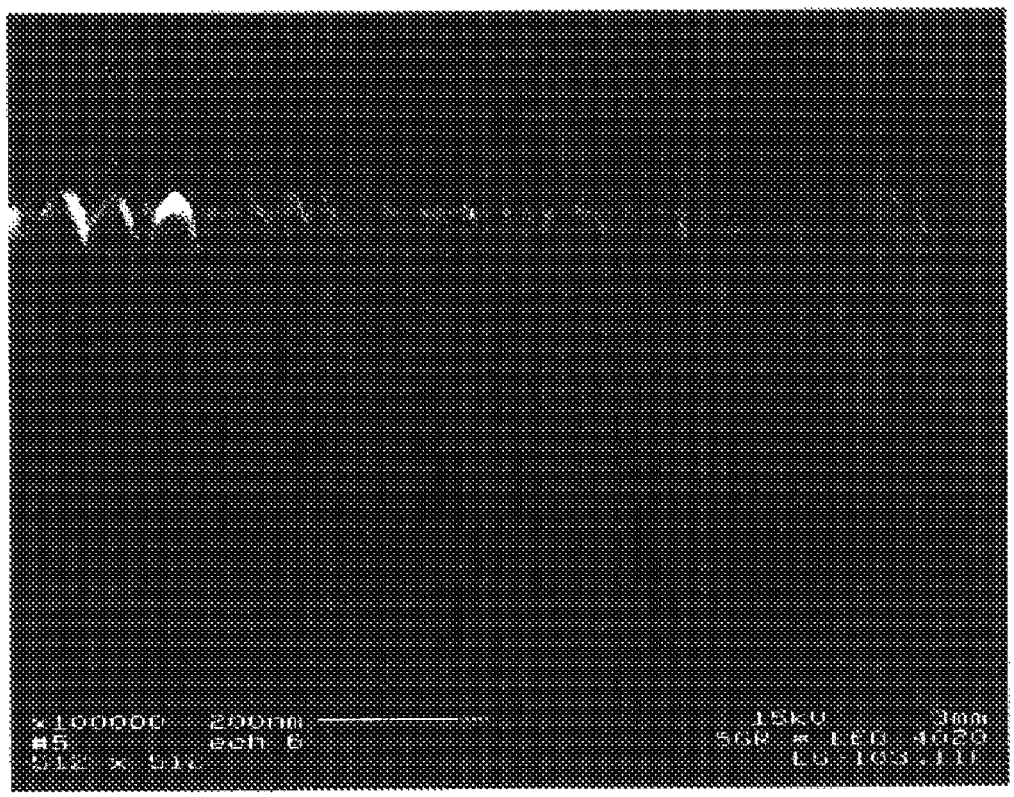

FIGS. 3 and 4 are micrographs, of Examples C2 and 1 respectively, taken under a scanning electron microscope with a 100 000 magnification. The micrographs were taken on the edge, thus enabling the ZnO/GaN stack to be displayed.

In FIG. 3, the hexagonal GaN crystals have a tendency to grow along their c-axis but the direction of the axis is not completely perpendicular to the substrate.

In FIG. 4 however, the growth direction of the GaN crystals is perfectly perpendicular to the substrate and therefore more free of defects.

According to a third method, the overall electrical resistivity of the stack was determined in a known manner using the 4-point method or Van der Pauw method.

Table 3 indicates the values obtained for Examples C1, 3 and 4.

TABLE 3

| Example | Resistivity ($\Omega \cdot cm$) |
|---|---|
| C1 | 0.055 |
| 3 | 0.019 |
| 4 | 0.015 |

The drop in resistivity due to the addition of the intermediate layer corresponds to a very substantial increase in the electronic conductivity, reflecting a smaller amount of structure defect.

The interposition in the substrate according to the invention of an intermediate layer between the support material and the zinc oxide layer consequently makes it possible to improve the crystalline characteristics of the gallium nitride layer and to increase its electronic conductivity. This results in an increase in the emission intensity and the lifetime of light-emitting diodes using these substrates.

The invention claimed is:

1. A substrate comprising a support material coated on at least one face thereof with at least one multilayered stack comprising at least one zinc oxide comprising layer, said substrate coated with a III-N or II-VI semiconductor structure, wherein at least one intermediate layer is present between the support material and said at least one zinc oxide comprising layer, said at least one intermediate layer comprising oxides of at least two elements selected from the group consisting of tin (Sn), zinc (Zn), indium (In), gallium (Ga) and antimony (Sb), wherein the intermediate layer is amorphous before the zinc oxide comprising layer is deposited.

2. The substrate as claimed in claim 1, wherein the zinc oxide comprising layer consists of polycrystalline zinc oxide crystallized in the hexagonal form.

3. A substrate, comprising a support material coated on at least one face thereof with at least one multilayered stack comprising at least one zinc oxide comprising layer, wherein at least one intermediate layer is present between the support material and said at least one zinc oxide comprising layer, said at least one intermediate layer comprising oxides of at least two elements selected from the group consisting of tin (Sn), zinc (Zn), gallium (Ga) and antimony (Sb), wherein the intermediate layer is amorphous before the zinc oxide comprising layer is deposited.

4. The substrate as claimed in claim 3, wherein the support material is coated on only one face thereof and the multilayer consists of a single zinc oxide comprising layer or a single intermediate layer.

5. The substrate as claimed in claim 3, wherein the support material is a material chosen from: sapphire; silicon carbide; silicon; metal; quartz; zinc oxide (ZnO); a spinel; or a glassy or amorphous material.

6. The substrate as claimed in claim 3, wherein the support material is a silica glass, the strain point of which is equal to or above 550° C.

7. The substrate as claimed in claim 3, wherein at least one sublayer is present between the support material and the intermediate layer.

8. The substrate as claimed in claim 7, wherein the sublayer is a sublayer operable as a barrier to the migration of alkali metal ions, said sublayer comprising at least one of: SiOC, $Si_3N_4$, $SiO_2$, TiN, and $Al_2O_3$, or mixtures thereof.

9. The substrate as claimed in claim 3, wherein the intermediate layer is present beneath the zinc oxide comprising layer in direct contact therewith.

10. The substrate as claimed in claim 3, wherein the intermediate layer is a layer comprised of zinc tin oxides.

11. The substrate as claimed in claim 10, wherein the intermediate layer is doped by at least one atom selected from the group consisting of Al, Ga, In, B, Y, La, Ge, Si, P, As, Sb, Bi, Ce, Ti, Zr, Nb and Ta.

12. The substrate as claimed in claim 3, wherein the zinc oxide comprising layer is a layer consisting of zinc oxide, in a wurtzite-type structure.

13. The substrate as claimed in claim 3, wherein the zinc oxide comprising layer is the final layer of the multilayer.

14. The substrate as claimed in claim 3, wherein the thickness of the zinc oxide comprising layer is between 10 and 500 nm.

15. The substrate as claimed in claim 3, wherein the thickness of the intermediate layer is between 2 and 100 nm.

16. The substrate as claimed in claim 3, coated with a III-N or II-VI semiconductor structure.

17. The substrate as claimed in claim 16, wherein the semiconductor structure of III-N type comprises at least one layer based on gallium nitride (GaN).

18. The substrate as claimed in claim 16, wherein the semiconductor structure of II-VI type comprises at least one layer based on zinc oxide (ZnO).

19. The substrate as claimed in claim 16, wherein the semiconductor structure comprises at least one noncontinuous layer formed of nanostructures.

20. A process for obtaining a substrate comprising a support material coated on at least one face thereof with at least one multilayered stack comprising at least one zinc oxide comprising layer, wherein at least one intermediate layer is present between the support material and said at least one zinc oxide comprising layer, said at least one intermediate layer comprising oxides of at least two elements selected from the group consisting of tin (Sn), zinc (Zn), gallium (Ga) and antimony (Sb), wherein said at least one zinc oxide comprising layer and said at least one intermediate layer are deposited by sputtering, wherein said depositing the intermediate layer produces an amorphous layer.

* * * * *